US012795830B2

(12) United States Patent
Heinrich et al.

(10) Patent No.: US 12,795,830 B2
(45) Date of Patent: Nov. 10, 2026

(54) COMPILATION OF ASSEMBLY INFORMATION FOR MODULAR ASSEMBLIES

(71) Applicant: HEWLETT PACKARD ENTERPRISE DEVELOPMENT LP, Spring, TX (US)

(72) Inventors: David F. Heinrich, Tomball, TX (US); Andrew C. Cartes, Cypress, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 432 days.

(21) Appl. No.: 18/407,682

(22) Filed: Jan. 9, 2024

(65) Prior Publication Data

US 2025/0227844 A1 Jul. 10, 2025

(51) Int. Cl.
*H05K 1/14* (2006.01)

(52) U.S. Cl.
CPC .................................... *H05K 1/141* (2013.01)

(58) Field of Classification Search
CPC ............................ H05K 1/141; G06F 11/3051
See application file for complete search history.

(56) References Cited

U.S. PATENT DOCUMENTS 9,311,208 B2 * 4/2016 Messer ............... G06F 11/3051
12,259,958 B2 * 3/2025 Shear ...................... G06F 21/32
12,619,242 B2 * 5/2026 Thomas ............... B62D 65/022
2003/0148672 A1 * 8/2003 Henry .................... G01D 21/02 439/894
2004/0228063 A1 * 11/2004 Hawkins ............. G06F 13/4291 361/115
2006/0167919 A1 * 7/2006 Hsieh .................. G06F 11/3698
2010/0106562 A1 * 4/2010 Taylor ................ G06Q 30/0257 705/14.54
2013/0204984 A1 * 8/2013 Meyer ................... G06F 15/161 709/220
2014/0122753 A1 * 5/2014 Chiu ..................... G06F 3/0604 710/74
2015/0046761 A1 * 2/2015 Messer ................... G06F 11/00 714/710
2023/0368605 A1 * 11/2023 Urban ................. G07F 17/3216
2024/0086536 A1 * 3/2024 Rosen .................. G06F 21/566

FOREIGN PATENT DOCUMENTS

CN 104361112 A 2/2015
CN 108958990 A 12/2018
CN 113805947 A 12/2021
CN 114003256 A 2/2022

* cited by examiner

*Primary Examiner* — Ziaul Karim
(74) *Attorney, Agent, or Firm* — Trop, Pruner & Hu, P.C.

(57) ABSTRACT

In some examples, a management controller identifies modular assemblies installed in an electronic device, accesses a data repository based on the identified modular assemblies to retrieve assembly information elements of the identified modular assemblies, and obtains a compiled representation of the assembly information elements. The management controller stores, in a memory, the compiled representation of the assembly information elements. Machine-readable instruction cause the electronic device to use the compiled representation of the assembly information elements retrieved from the memory in interactions with the modular assemblies.

20 Claims, 4 Drawing Sheets

COMPILATION OF ASSEMBLY INFORMATION FOR MODULAR ASSEMBLIES

BACKGROUND

An electronic device includes various electronic components that have respective functionalities. Examples of electronic components include a central processing unit (CPU), a memory device, a storage device, an input/output (I/O) device, or other types of electronic components.

BRIEF DESCRIPTION OF THE DRAWINGS

Some implementations of the present disclosure are described with respect to the following figures.

Figure 1:
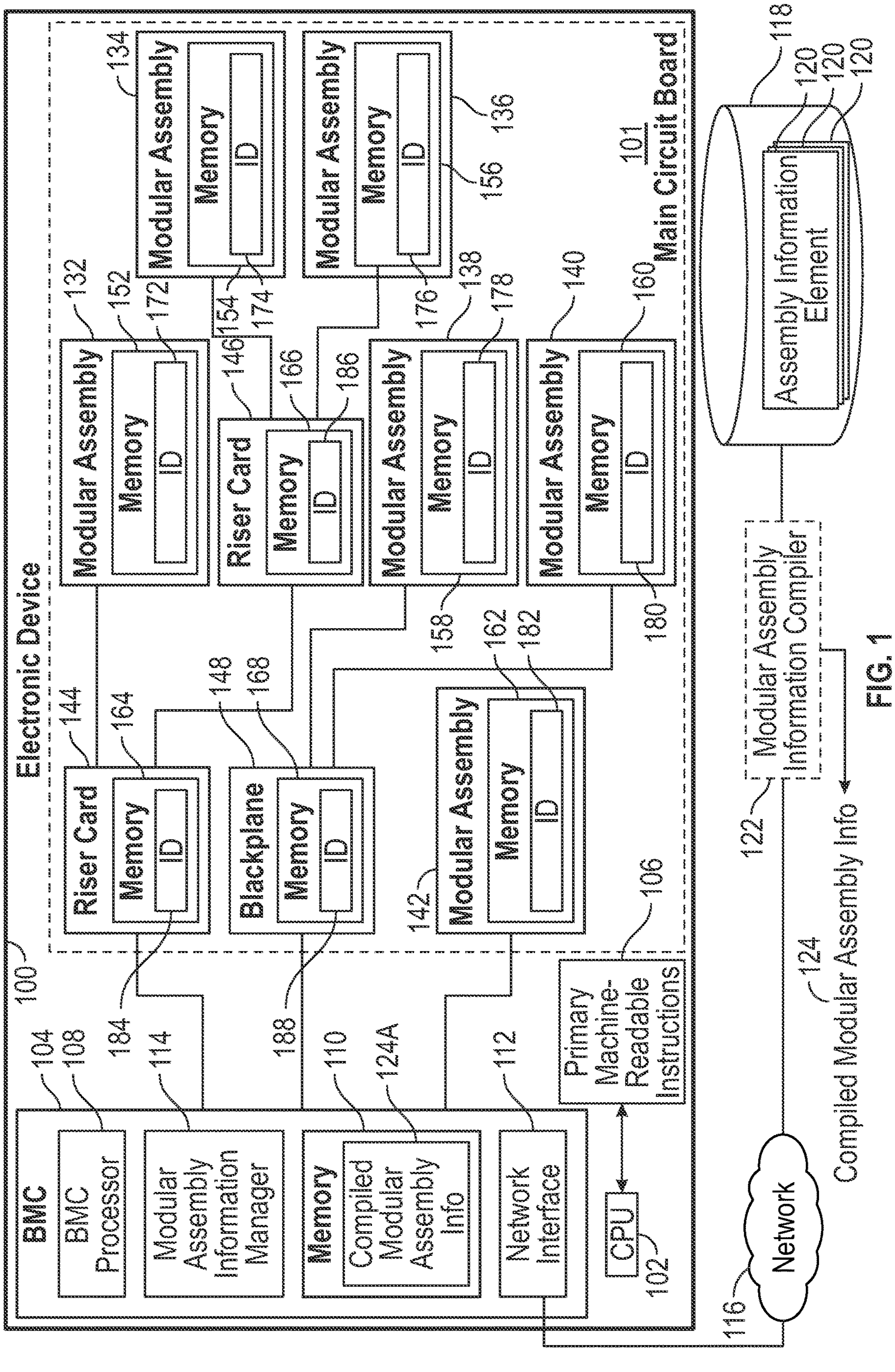
FIG. 1 is a block diagram of an electronic device including a baseboard management controller (BMC) and modular assemblies, in accordance with some examples.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

An electronic device can have a modular design in which modular assemblies can be removably added to the electronic device. In some examples, modular assemblies include field replaceable units (FRUs) that can be added or replaced in the field, e.g., after initial manufacture of the electronic device and after the electronic device has been deployed in the field, such as in an office, in a home, or any other location. Examples of modular assemblies include power supplies, storage drives, memory modules, processor modules, security modules, circuit boards, input/output (I/O) devices, fan controller boards, riser cards, or any other modules that include electronic circuitry.

The universe of candidate modular assemblies that may potentially be included in any given electronic device can be quite large. A "given electronic device" can refer to an individual electronic device or to a type of electronic device. A vendor or manufacturer of the given electronic device may decide to include some subset (but not all) of the universe of candidate modular assemblies in the given electronic device. Machine-readable instructions such as firmware or software in the given electronic device may manage or perform other interactions with modular assemblies installed in the given electronic device. Examples of such interactions include obtaining additional information from an external source for modular assemblies, managing configuration settings of modular assemblies, adjusting operations of modular assemblies, updating machine-readable instructions of modular assemblies, performing thermal and/or power management of modular assemblies, determining compatibility of machine-readable instructions (e.g., software or firmware) of modular assemblies, or other interactions.

To be able to perform interactions with installed modular assemblies, the machine-readable instructions can access assembly information regarding the installed modular assemblies. In some examples, the assembly information includes self-identifying, self-describing data. The self-identifying, self-describing data can include any or some combination of the following: information relating to a model of a modular assembly (e.g., model number), a part number of the modular assembly, a serial number of the modular assembly, information identifying a manufacturing lot that the modular assembly is part of, a manufacturing date of the modular assembly, revision information identifying a revision of the modular assembly, a thermal operation parameter that relates to a thermal operation of the modular assembly, a power operation parameter that relates to a power operation of the modular assembly, link information including a reference link to further information stored at a resource (e.g., a web resource, a resource in the cloud, a resource in a data center, etc.), an image relating to the modular assembly, or other information that identifies and/or describes the modular assembly. In further examples, the self-identifying, self-describing data can include program code, such as a script or another type of program code. The program code can be executed for the modular assembly. In additional examples, the self-identifying, self-describing data may further include information of a management protocol supported by a modular assembly (e.g., a Management Control Transport Protocol (MCTP) from the Distributed Management Task Force (DTMF) that relates to an exchange of dynamic data such as runtime telemetry data and security data).

In further examples, the self-identifying, self-describing data can include connectivity information relating to connectivity of a first modular assembly to a second modular assembly. This connectivity information can be used to access the second modular assembly through the first modular assembly, for example.

The machine-readable instructions can use the assembly information to identify each installed modular assembly and determine the type or category of the installed modular assembly, as well as determine other information associated with the installed modular assembly (including any of the assembly information listed above). By relying on the assembly information, the machine-readable instructions do not have to be modified as new modular assemblies are added to the given electronic device or existing modular assemblies are modified.

The size of the assembly information for a modular assembly can be quite large. Different modular assemblies can be associated with assembly information of different sizes. Moreover, different applications of a modular assembly can cause the assembly information to vary in size. For example, if the modular assembly is to be used in a first application, a first collection of assembly information can be used. However, if the modular assembly is to be used in a second application, a second collection of assembly information can be used, where the second collection of assembly information may include more or less information than the first collection of assembly information.

Storing the assembly information on the modular assembly itself can increase the cost of the modular assembly, since the modular assembly would have to be configured with a memory of sufficient size to accommodate the largest expected size of assembly information across multiple applications or across multiple different types or versions of modular assemblies.

Moreover, if there is a large quantity of candidate modular assemblies in the universe of candidate modular assemblies that may potentially be included in electronic devices, the collective amount of assembly information for all modular assemblies of the universe of candidate modular assemblies may be quite large, and having to store the collective amount of assembly information in an electronic device can consume storage resources of the electronic device that can result in less storage capacity for other functionalities of the electronic device.

In accordance with some implementations of the present disclosure, techniques or mechanisms employ a management controller in an electronic device to identify modular assemblies installed in an electronic device. Based on the identified modular assemblies, the management controller can access a data repository to retrieve assembly information elements of the identified modular assemblies. The data repository can include respective instances of self-identifying, self-describing data for different categories or versions of modular assemblies, for example. Also, the data repository can include self-identifying, self-describing data for all modular assemblies in a universe of candidate modular assemblies that may potentially be included in the electronic device. Note that the modular assemblies actually installed in the electronic device may be less than all of the modular assemblies in the universe of candidate modular assemblies.

The management controller obtains a compiled representation of the assembly information elements for the identified modular assemblies that are installed in the electronic device, and stores, in a memory, the compiled representation of the assembly information elements. Machine-readable instructions of the electronic device can use the compiled representation of the assembly information elements retrieved from the memory in interactions with the installed modular assemblies. In some examples, the machine-readable instructions include firmware or software executed by the management controller. In further examples, the machine-readable instructions can additionally or alternatively include firmware or software executed by a CPU of the electronic device, where the CPU is separate from the management controller.

A CPU can include one or more processors, which form a processing resource of an electronic device. The CPU executes primary machine-readable instructions such as an operating system (OS), an application program, system firmware (e.g., Basic Input/Output System (BIOS) code or Universal Extensible Firmware Interface (UEFI) code), or other software or firmware. A processor can include a microprocessor, a core of a multi-core microprocessor, a microcontroller, a programmable integrated circuit, a programmable gate array, or another hardware processing circuit.

FIG. 1 is a block diagram of an example electronic device 100. Examples of the electronic device 100 can include any or some combination of the following: a computer (e.g., a desktop computer, a notebook computer, a tablet computer, a server computer, or another type of computer), a communication node (e.g., a switch, a router, a gateway, or another type of device that supports communications), a storage system, a game appliance, an Internet of Things (IoT) device, a household appliance, a vehicle, or any other type of electronic device.

The electronic device 100 includes a CPU 102 and a baseboard management controller (BMC) 104. As noted above, the CPU 102 includes the processing resource of the electronic device 100 that executes primary machine-readable instructions 106, such as any or some combination of the following: an OS, an application program, system firmware, or any other software or firmware. "Primary" machine-readable instructions are distinct (and separate) from machine-readable instructions (such as firmware or software) executable by other electronic components (separate from the CPU 102). The primary machine-readable instructions 106 may be stored in a storage medium (not shown in FIG. 1).

The BMC 104 is an example of a management controller that performs various management tasks, which are discussed further below. As used here, a "controller" can refer to one or more hardware processing circuits, which can include any or some combination of a microprocessor, a core of a multi-core microprocessor, a microcontroller, a programmable integrated circuit, a programmable gate array, or another hardware processing circuit. Alternatively, a "controller" can refer to a combination of one or more hardware processing circuits and machine-readable instructions (software and/or firmware) executable on the one or more hardware processing circuits.

The BMC 104 includes a BMC processor 108, a memory 110, a network interface 112, and a modular assembly information manager 114. The BMC processor 108 executes machine-readable instructions of the BMC 104 to perform management tasks of the BMC 104. The machine-readable instructions executable by the BMC processor 108 can include firmware or software of the BMC 104. The BMC processor 108 is separate from the CPU 102.

The memory 110 of the BMC 104 can be implemented using one or more memory devices, such as any or some combination of the following: a dynamic random access memory (DRAM) device, a static random access memory (SRAM) device, a flash memory device, or any other type of memory device. Although FIG. 1 shows the memory 110 as being part of the BMC 104, in other examples, the memory 110 can be external of (but connected to) the BMC 104.

The network interface 112 allows the BMC 104 to communicate over an external network, such as a network 116. The network 116 can be any or some combination of the following: a local area network (LAN), a wide area network (WAN), a storage area network (SAN), the Internet, or any other type of network. The network interface 112 can include a transceiver to transmit and receive signals over the network 116, as well as any protocol layers that manage protocols used for network communications. The network interface 112 of the BMC 104 can be separate from a network interface (not shown) of the electronic device 100. The network 116 may be a management network used by the BMC 104 for management tasks of the BMC 104. The management network can be separate from a "production network" used by the electronic device 100 for communications associated with operations of the electronic device 100 performed by the primary machine-readable instructions 106.

The modular assembly information manager 114 obtains compiled modular assembly information for modular assemblies actually installed in the electronic device 100. The modular assembly information manager 114 obtains compiled assembly information for the installed modular assemblies by either (1) retrieving respective assembly information elements 120 for the installed modular assemblies and compiling the assembly information elements 120 at the BMC 104, or (2) receiving the compiled modular assembly information from an entity external of the BMC 104, such as a modular assembly information compiler 122 connected to the network 116. The compiled assembly information can be produced by collecting the assembly information elements 120 for the installed modular assemblies and adding the collected the assembly information elements 120 into a data structure (the compiled assembly information), which can include a text file, a table, or any other container of data. The data structure can correlate installed modular assemblies (e.g., identifiers of modular assemblies) to respective assembly information elements 120. For example, the data structure may include multiple entries, where each entry correlates an identifier of an installed modular assembly to the respective assembly information element 120 for the installed modular assembly. An assembly information element 120 included in an entry of the compiled assembly information can include any or some combination of the following: information relating to a model of a modular assembly (e.g., model number), a part number of the modular assembly, a serial number of the modular assembly, information identifying a manufacturing lot that the modular assembly is part of, a manufacturing date of the modular assembly, revision information identifying a revision of the modular assembly, a thermal operation parameter that relates to a thermal operation of the modular assembly, a power operation parameter that relates to a power operation of the modular assembly, link information including a reference link to further information stored at a resource, an image relating to the modular assembly, program code, such as a script or another type of program code, information of a management protocol supported by a modular assembly, connectivity information relating to connectivity of a first modular assembly to a second modular assembly, or any other assembly information.

In some examples, the modular assembly information manager 114 can be implemented as machine-readable instructions executed by the BMC processor 108. In other examples, the modular assembly information manager 114 can be implemented using hardware processing circuitry of the BMC 104.

Example modular assemblies in the electronic device 100 include modular assemblies 132, 134, 136, 138, 140, and 142. The modular assembly 132 is connected to a riser card 144 (or more specifically, to an expansion connector of the riser card 144). A "riser card" refers to an expansion board that rises above a surface of a main circuit board 101 of the electronic device 100, so that space is provided for a separate electronic component to be connected to a connector of the riser card 144. A "connector" can refer to any connecting structure including electrical and/or optical contacts to connect to an electronic component. The connecting structure can be in the form of a slot including contacts (electrical contacts and/or optical contacts), a projection including contacts, or any other structure with contacts to allow one electronic component to be connected to another electronic component.

The riser card 144 can in turn also be connected to another riser card 146. For example, the riser card 146 may be connected to a connector of the riser card 144. The modular assemblies 134 and 136 are connected to the riser card 146, or more specifically, to connectors of the riser card 146.

The electronic device 100 also includes a backplane 148, which is an example of a connection plane with connectors to connect to other electronic components, including the modular assemblies 138 and 140. A connection plane refers to any structure that includes electrically and/or optically conductive lines as well as a circuitry and connectors to allow for connection of various electronic components, such as a connection of the modular assemblies 138 and 140 through the backplane 148 to another electronic component, such as the main circuit board 101 of the electronic device 100. Examples of connection planes include a backplane, a midplane, a riser card, and so forth.

The riser cards 144 and 146 and the backplane 148 are examples of intermediate connection structures that connect electronic components to the electronic device 100, such as to the main circuit board 101 of the electronic device 100. The modular assembly 142 is not connected through an intermediate connecting structure, but may be connected to the main circuit board 101 or another structure of the electronic device 100.

The modular assemblies 132, 134, 136, 138, 140, and 142 are considered optional modular assemblies that may or may not be installed in the electronic device 100. The riser cards 144 and 146 and the backplane 148 are themselves optional modular assemblies that may or may not be present in the electronic device 100.

More generally, a universe of candidate modular assemblies exist that include modular assemblies that may potentially be included in any given electronic device (including the electronic device 100). Installed modular assemblies in an electronic device can include a subset (less than all) of the modular assemblies of the universe of candidate modular assemblies.

In accordance with some implementations of the present disclosure, the modular assembly information manager 114 of the BMC 104 is able to identify modular assemblies (132 to 148) installed in the electronic device 100. The identification of the installed modular assemblies can be based on retrieving identifiers (IDs) of the modular assemblies from respective memories of the modular assemblies. For example, the modular assembly 132 includes a memory 152 that stores an identifier 172 of the modular assembly 132, the modular assembly 134 includes a memory 154 that stores an identifier 174 of the modular assembly 134, the modular assembly 136 includes a memory 156 that stores an identifier 176 of the modular assembly 136, the modular assembly 138 includes a memory 158 that stores an identifier 178 of the modular assembly 138, the modular assembly 140 includes a memory 160 that stores an identifier 180 of the modular assembly 140, and the modular assembly 142 includes a memory 162 that stores an identifier 182 of the modular assembly 142. The riser card 144 includes a memory 164 that stores an identifier 184 of the riser card 144, the riser card 146 includes a memory 166 that stores an identifier 186 of the riser card 146, and the backplane 148 includes a memory 168 that stores an identifier 188 of the backplane 148.

An "identifier" can refer to any information that can be used to identify a modular assembly. The identifier can include a string of characters, a number, a symbol, or any other information that can be used to distinguish one modular assembly from another modular assembly. Specific examples of identifiers can include a globally unique identifier (GUID), a universally unique identifier (UUID), or another type of identifier.

The retrieval of the identifiers 172 to 188 from the respective modular assemblies 132 to 148 may be performed by the BMC 104 over links (e.g., buses or other types of links) between the BMC 104 and the riser card 144, the backplane 148, and the modular assembly 142. Note that a link can refer to a direct link that connects the BMC 104 to another component, or an indirect link that includes one or more intermediate devices between the BMC 104 and another component. The BMC 104 can access the memory

152 of the modular assembly 132 through the riser card 144, the BMC 104 can access the memories 154 and 156 of the modular assemblies 134 and 136 through the riser cards 144 and 146, the BMC 104 can access the memories 158 and 160 of the modular assemblies 138 and 140 through the backplane 148, and the BMC 104 can access the memory 162 of the modular assembly 142 over a direct link.

The memories 152 to 168 may store the respective identifiers 172 to 188 but not other modular assembly information (e.g., self-identifying, self-describing data) of the respective modular assemblies. As a result, the amount of information stored in each memory 152 to 168 may be much smaller than the overall modular assembly that may be associated with a given modular assembly. The size of a memory in a modular assembly can thus be relatively small, so that a large-size memory (which is more costly and can take up additional physical space) does not have to be included in the modular assembly.

After identifying the installed modular assemblies, the modular assembly information manager 114 issues, through the network interface 112 and over the network 116 (which can be a management network as noted above), a request to obtain modular assembly information for the installed modular assemblies. As shown in FIG. 1, a data repository 118, which can be part of a cloud, a server, a data center, or at any other location, can store assembly information elements 120 for modular assemblies of a universe of candidate modular assemblies that may be potentially included in any electronic device. An assembly information element 120 represents an instance of modular assembly information for a modular assembly that is part of the universe of candidate modular assemblies. The assembly information element 120 can include any or some combination of the modular assembly information listed further above. The data repository 118 can be stored in one or more storage devices, such as disk-based storage devices, solid-state drives, memory devices, or any other types of storage devices.

In some examples, the compilation of assembly information elements 120 for the installed modular assemblies is performed by the modular assembly information compiler 122, which may be implemented using one or more computers outside the electronic device 100. In such examples, the modular assembly information manager 114 sends the request to obtain modular assembly information for the installed modular assemblies to the modular assembly information compiler 122. The request can be in the form of one or more messages, one or more calls of a programming interface such as an application programming interface (API), or any other type of information that indicates that modular assembly information is being sought.

The request can include the identifiers of the installed modular assemblies retrieved by the modular assembly information manager 114 from the memories of the installed modular assemblies. In response to the request, the modular assembly information compiler 122 retrieves assembly information elements 120 corresponding to the identifiers from the data repository 118. For example, the modular assembly information compiler 122 may maintain mapping information that maps identifiers of modular assemblies to identifiers of corresponding assembly information elements 120. The modular assembly information compiler 122 can provide the identifiers of corresponding assembly information elements 120 to the data repository 118, which responds with the corresponding assembly information elements 120. Note that in some cases, the assembly information elements 120 for the installed modular assemblies may reside in multiple different data sources. In such examples, the data repository 118 may represent the multiple different data sources, and partial modular assembly information retrieved from the multiple different data sources may be compiled. If the data repository 122 is in the form of a database, the modular assembly information compiler 122 can issue queries to the database, where a query can include one or more identifiers of corresponding assembly information element (s) 120 sought by the modular assembly information compiler 122.

The modular assembly information compiler 122 compiles the assembly information elements 120 returned from the data repository 118 into compiled modular assembly information 124. The compiled modular assembly information 124 contains the modular assembly information for the installed modular assemblies in the electronic device 100. The modular assembly information compiler 122 sends (over the network 116) the compiled modular assembly information 124 to the BMC 104. As noted above, the compiled modular assembly information can be included in a data structure that has entries, where each entry correlates an installed modular assembly (e.g., an identifier of the installed modular assembly to a respective assembly information element 120). As the assembly information elements 120 are returned to the modular assembly information compiler 122 in response to the queries issued to the data repository 118, the modular assembly information compiler 122 adds the assembly information elements 120 to respective entries of the data structure.

In response to receiving the compiled modular assembly information 124 from the modular assembly information compiler 122, the modular assembly information manager 114 stores the compiled modular assembly information 124 in the memory 110 of the BMC 104. The stored compiled modular assembly information is represented as 124A. The compiled modular assembly information 124A can have any of various formats, such as a JavaScript Object Notation (JSON) format), a markup language format, an image format, or any other format.

In other examples, instead of using the modular assembly information compiler 122 that is external of the electronic device 100 to compile assembly information elements retrieved from the data repository 118, the modular assembly information manager 114 can perform the compilation of assembly information elements 120 retrieved from the data repository 118. In such examples, the modular assembly information manager 114 in the BMC 104 sends, to the data repository 118, a request including identifiers of the installed modular assemblies (or including identifiers of corresponding assembly information elements 120 mapped to the identifiers of the installed modular assemblies). In response to the request, the data repository 118 sends the corresponding assembly information elements 120 to the modular assembly information manager 114, which compiles the corresponding assembly information elements 120 and stores the compiled modular assembly information 124A in the memory 110.

In alternative examples, instead of obtaining assembly information elements over a network such as the network 116, the modular assembly information manager 114 can obtain the assembly information elements from a storage medium that is part of or attached to the electronic device 100 (e.g., to a port of the electronic device 100). After obtaining identifiers of the modular assemblies from respective memories of the modular assemblies, the modular assembly information manager 114 can read a file (or other data structure) stored in the storage medium to retrieve and compile the assembly information elements corresponding to the modular assemblies into the compiled modular assembly information 124A.

In yet other examples, the modular assembly information manager 114 can obtain the assembly information elements from the memories of the modular assemblies to compile the assembly information elements into the compiled modular assembly information 124A.

In yet further examples, in addition to or as an alternative to identifiers of modular assemblies, the memories of the modular assemblies store reference links that can be used by the modular assembly information manager 114 or the modular assembly information compiler 122 to retrieve assembly information elements referred to by the reference links.

Note that the compiled modular assembly information 124A that is stored in the memory 110 can be available in the future so that re-compilation of modular assembly information does not have to be repeated, unless a change is made to the electronic device 100 that results in the addition, removal, or modification of a modular assembly. A change in modular assemblies can be detected if an identifier of any modular assembly in the electronic device is not present in the compiled modular assembly information 124A.

Note that the modular assembly information manager 114 does not obtain any assembly information element for a modular assembly that is not installed in the electronic device 100. As a result, the stored compiled modular assembly information 124A in the memory 110 is based on a subset of the assembly information elements 120 in the data repository 118, where the subset excludes modular assembly information for any modular assembly not installed in the electronic device 100. By excluding modular assembly information for un-installed modular assemblies, the overall size of the compiled modular assembly information 124A is reduced, which saves storage space in the BMC 104.

The process of identifying installed modular assemblies, obtaining compiled modular assembly information for the installed modular assemblies, and storing of the compiled modular assembly information can be performed during a manufacturing stage, such as a level 10 (L10) stage, of the electronic device 100. The manufacture process of electronic devices can include multiple stages, including the L10 stage in which full assembly of an electronic device occurs, and testing of various components of the electronic device occurs. In other examples, the process of identifying installed modular assemblies, obtaining compiled modular assembly information for the installed modular assemblies, and storing of the compiled modular assembly information can be performed at a different stage of the manufacturing process, or can occur after manufacturing of an electronic device has been completed and the electronic device has been moved to a different location (different from the location at which the electronic device is manufactured or assembled).

As noted further above, modular assembly information for a modular assembly can include self-identifying, self-describing data, which may include any or some combination of the following: model information, a part number, a serial number, manufacturing lot information, a manufacturing date, revision information, a thermal operation parameter, a power operation parameter, reference link information, an image relating to the modular assembly, management protocol information, connectivity information, program code, or other information that identifies and/or describes the modular assembly.

After the manufacture of the electronic device 100 (that includes storing the compiled modular assembly information 124A) in the memory 110 of the BMC 104, the electronic device 100 can be deployed for use, such as in an office, in a home, in a data center, in a cloud computing environment, or at any other location. Machine-readable instructions can be executed in the electronic device 100 to access the compiled modular assembly information 124A from the memory 110, which contains information to allow the machine-readable instructions to perform interactions with modular assemblies in the electronic device. The machine-readable instructions can include firmware or software executed by the BMC 104 and/or the CPU 102. Examples of interactions with modular assemblies can include any or some combination of the following: obtaining additional information from an external source for modular assemblies, managing configuration settings of modular assemblies, adjusting operations of modular assemblies (e.g., enable or disable power to a modular assembly, resetting a modular assembly, isolate a modular assembly, etc.), updating machine-readable instructions (e.g., firmware or software) of modular assemblies, performing thermal and/or power management of modular assemblies, determining compatibility of machine-readable instructions (e.g., software or firmware) of modular assemblies, collecting telemetry data including metrics relating to usage and/or performance of resources (e.g., processor usage or performance metrics, storage usage or performance metrics, information relating to errors or faults, network latency metrics, or other metrics), or other interactions.

In a more specific example, the compiled modular assembly information 124A can include a reference link (e.g., a uniform resource identifier or URI) that refers to an external source of information for a given modular assembly. The machine-readable instructions in the electronic device can follow the link to obtain the information for the given modular assembly. The reference link can refer to a file or any other type of information object that contains the information for the given modular assembly. The information object referred to by the reference link may be updated over time. In an example, the given modular assembly to be included in electronic devices may be under development, so that the information for the given modular assembly may not be final during development of the given modular assembly. As details of the given modular assembly are updated during the development, the information object may be updated so that the reference link for the given modular assembly in the compiled modular assembly information 124A may be used to obtain the latest information for the given modular assembly and added to the compiled modular assembly information 124A. The information object for the given modular assembly may also be updated after deployment of the electronic devices including the given modular assembly in the field, such as to address bugs or other issues.

In another specific example, the compiled modular assembly information 124A can include a management protocol supported by a given modular assembly. The machine-readable instructions in the electronic device can use the management protocol to perform security checks, such as for attesting that the modular assembly is not counterfeit.

In a further example, the self-identifying, self-describing data can include connectivity information relating to connectivity of a first modular assembly to a second modular assembly. For example, the connectivity information of the modular assembly 138 can indicate that the modular assembly 138 is connected to the backplane 148. Therefore, the machine-readable instructions in the electronic device can use the connectivity information to determine that the modular assembly 138 is connected through the backplane 148.

In further examples, the self-identifying, self-describing data may include program code that can be launched by the machine-readable instructions in the electronic device to perform specified functionalities for a given modular assembly.

As depicted in FIG. 1, the arrangement of modular assemblies may be hierarchical in nature. For example, modular assemblies may be coupled to a host through other modular assemblies. As used here, the "host" refers to a primary system to which modular assemblies can be directly or indirectly connected. An example of a primary system is the main circuit board 101 of the electronic device 100, for example. In FIG. 1, the modular assembly 132 is coupled to the host through the riser card 144 (another modular assembly). The modular assemblies 134 and 136 are coupled to the host through the riser card 146 and the riser card 144 (two other modular assemblies). Such an arrangement of modular assemblies includes a hierarchical interconnection of the modular assemblies installed in the electronic device 100.

Figure 2:
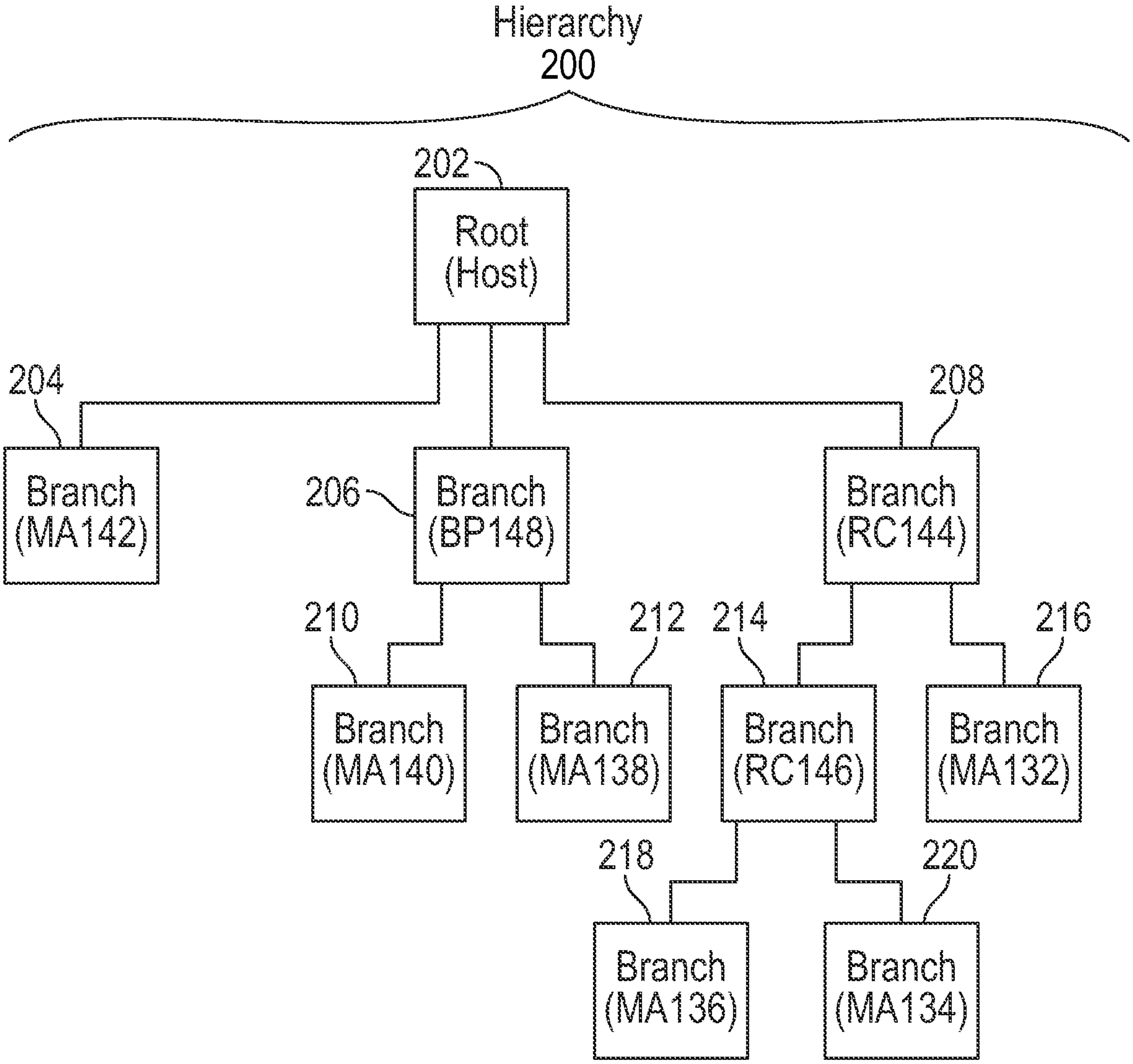
FIG. 2 is a block diagram illustrating a hierarchical arrangement of assembly information elements for modular assemblies, in accordance with some examples.

The compiled modular assembly information 124A for the hierarchical arrangement of modular assemblies can be accumulated in a hierarchical manner, based on connectivity information contained in the assembly information elements for the modular assemblies. FIG. 2 shows a hierarchy 200 of assembly information elements that contain the modular assembly information for the modular assemblies represented in the hierarchy 200. The hierarchy 200 includes a root 202 that represents the host to which the modular assemblies are coupled. As noted above, the host can refer to a primary system to which modular assemblies can be directly or indirectly connected. A primary system can be a main circuit board or any other structure that provides connectivity to modular assemblies, either directly or indirectly.

The modular assemblies are represented by respective branches in the hierarchy 200. The hierarchy 200 can include multiple levels of branches that depend from the root 202. A first level of branches includes branches 204, 206, and 208 that depend directly from the root 202. The branch 204 represents the modular assembly 142 that is connected to the primary system, the branch 206 represents the backplane 148 that is connected to the primary system, and the branch 208 represents the riser card 144 that is connected to the primary system.

A second level of branches (below the first level of branches) includes branches 210, 212, 214, and 216 that depend directly from respective branches 206 and 208.

The branch 210 represents the modular assembly 140 that is connected to the backplane 148 (represented by the branch 206), and the branch 212 represents the modular assembly 138 that is connected to the backplane 148. The branch 214 represents the riser card 146 that is connected to the riser card 144 (represented by the branch 208). The branch 216 represents the modular assembly 132 that is connected to the riser card 144.

A third level of branches include branches 218 and 220. The branch 218 represents the modular assembly 136 that is connected to the riser card 146 (represented by the branch 214), and the branch 220 represents the modular assembly 134 that is connected to the riser card 146.

The branches at 210, 212, 214, 216, 218, and 220 depend indirectly from the root 202.

Each branch includes an assembly information element for the modular assembly represented by the branch.

The modular assembly information compiler 122 or the modular assembly information manager 114 of FIG. 1 can apply a root of management process that gathers information of the primary system and accumulates information of the branches representing modular assemblies coupled to the primary system. Information for the primary system can include connectivity information identifying which modular assemblies are connected to the primary system. In the example of FIG. 1, the connectivity information of the primary system can indicate that the modular assembly 142, the backplane 148, and the riser card 144 are connected to the primary system (e.g., the main circuit board 101).

Then, traversing to the connectivity information of the modular assembly 142, the backplane 148, and the riser card 144, the root of management process can determine from the connectivity information that further modular assemblies are connected to the backplane 148 and the riser card 144. The root of management process can iterate through connectivity information of the further modular assemblies to continue to build the hierarchy 200 of assembly information elements. More generally, the root of management process can identify the modular assemblies installed in the electronic device 100 based on iteratively traversing assembly information elements in the multiple levels of branches.

Figure 3:
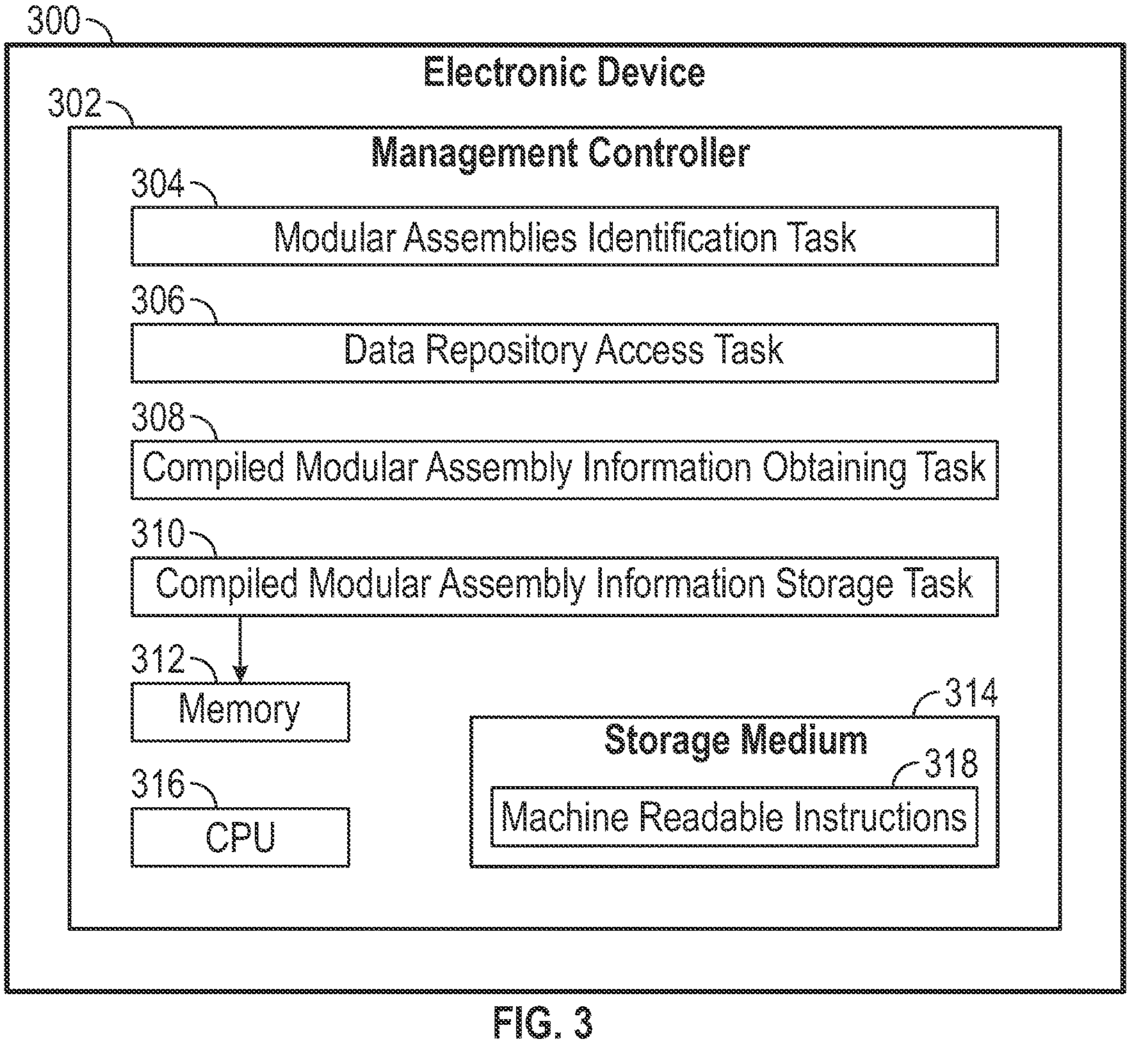
FIG. 3 is a block diagram of an electronic device including a management controller, in accordance with some examples.

FIG. 3 is a block diagram of an electronic device 300 according to some examples. The electronic device 300 includes a management controller 302 to perform various tasks. An example of the management controller 302 is a BMC or another type of management processor.

The tasks of the management controller 302 include a modular assemblies identification task 304 to identify modular assemblies installed in the electronic device 300. In some examples, the management controller 302 can access memories of the installed modular assemblies to retrieve identifiers of the installed modular assemblies from the memories.

The tasks of the management controller 302 include a data repository access task 306 to access a data repository (e.g., 118 in FIG. 1) based on the identified modular assemblies to retrieve assembly information elements of the installed modular assemblies. The access of the data repository can include sending, over a network, a request including the identifiers of the installed modular assemblies. The request can be submitted from the management controller to the data repository, which can return the assembly information elements correlated to the identifiers back to the management controller. Alternatively, the request can be submitted from the management controller to a modular assembly information compiler (e.g., 122 in FIG. 1), which retrieves the assembly information elements from the data repository, compiles the assembly information elements into a compiled representation of the assembly information elements, and returns the compiled representation of the assembly information elements to the management controller. In other examples, the accessed data repository can be part of a storage medium included in the electronic device 300 or attached to the electronic device 300 (e.g., to a port of the electronic device 300). In further examples, the accessed data repository can include memories of the modular assemblies. In other examples, the data repository can include multiple different data sources that include respective partial modular assembly information, where the partial modular assembly can be retrieved and compiled.

In some examples, the data repository stores assembly information elements for a collection of modular assemblies, where the installed modular assemblies are part of a subset (less than all) of the collection of modular assemblies. The collection of modular assemblies includes at least one modular assembly that is not part of the installed modular assemblies.

The tasks of the management controller 302 include a compiled modular assembly information obtaining task 308 to obtain the compiled representation of the assembly information elements. In some examples, the management controller 302 compiles the information assembly elements retrieved from the data repository into the compiled representation of the assembly information elements. In other examples, the management controller 302 receives the compiled representation of the assembly information elements from the modular assembly information compiler.

The tasks of the management controller 302 a compiled modular assembly information storage task 310 to store, in a memory 312 of the electronic device 300, the compiled representation of the assembly information elements.

The electronic device 300 further includes a storage medium 314 storing machine-readable instructions 318 that upon execution cause the electronic device 300 to use the compiled representation of the assembly information elements retrieved from the memory in interactions with the modular assemblies. The machine-readable instructions 318 can include machine-readable instructions executed by the management controller 302, and/or machine-readable instructions executed by a CPU 316 of the electronic device 300, where the CPU 316 is separate from the management controller 302.

In some examples, the assembly information elements include any or some combination of the following: information relating to a model of a modular assembly, a part number of a modular assembly, a serial number of a modular assembly, manufacturing information (e.g., manufacturing date, manufacturing lot, etc.) of a modular assembly, revision information of a modular assembly, thermal operation information of a modular assembly, power operation information of a modular assembly, program code for a modular assembly, information of a management protocol supported by a modular assembly, connectivity information of modular assemblies, and so forth.

In some examples, the management controller 302 identifies the modular assemblies installed in the electronic device based on application of a root of management process that gathers information of a primary system and accumulates information of a plurality of branches from the primary system, wherein the installed modular assemblies are represented by respective branches of the plurality of branches.

In some examples, the primary system is represented by a root of a hierarchy from which the plurality of branches depend.

In some examples, the plurality of branches include multiple levels of branches, and the management controller 302 identifies the installed modular assemblies in the electronic device based on iteratively traversing the multiple levels of branches using connectivity information in the assembly information elements.

In some examples, a branch in a first level of the multiple levels represents a connection plane (e.g., a backplane, a midplane, a riser card, etc.) to which one or more modular assemblies are removably connected, where the one or more modular assemblies are part of a second level in the hierarchy that is below the first level.

In some examples, an assembly information element for a first modular assembly of the installed modular assemblies includes a reference link that refers to an external source of information for the first modular assembly. The compiled representation of the assembly information elements obtained by the management controller 302 includes the information obtained from the external source using the reference link.

In some examples, the management controller 302 updates the compiled representation of the assembly information responsive to an update of the information in the external source for the first modular assembly. The management controller 302 may be provided with an indication that the information in the external source has been updated. Alternatively, the management controller 302 can periodically poll the external source to determine whether the information for the first modular assembly has been updated.

Figure 4:
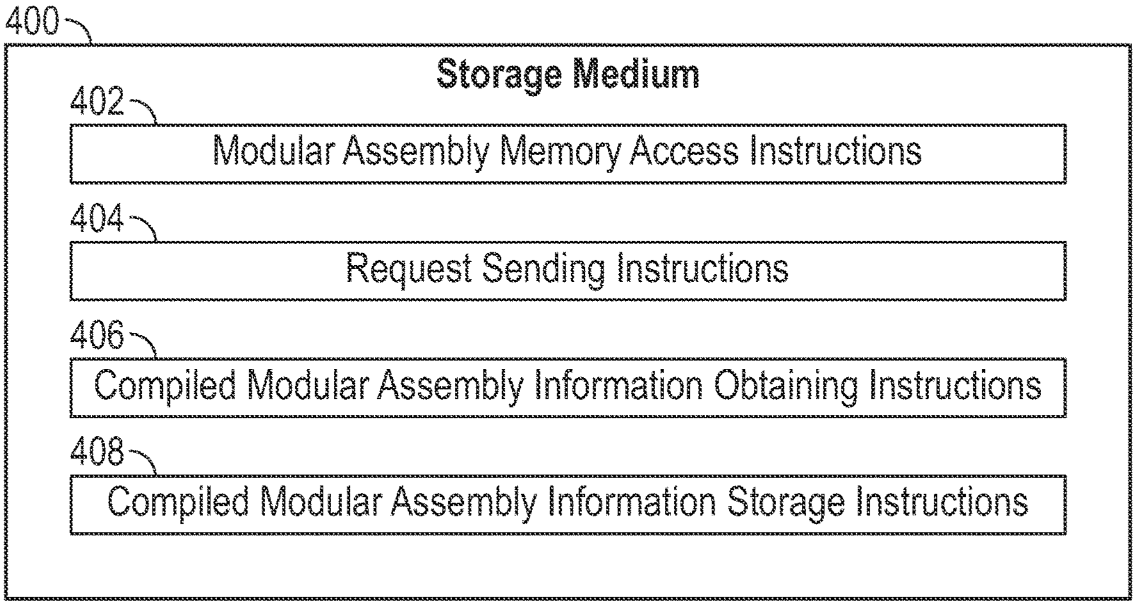
FIG. 4 is a block diagram of a storage medium storing machine-readable instructions according to some examples.

FIG. 4 is a block diagram of a non-transitory machine-readable or computer-readable storage medium 400 storing machine-readable instructions that upon execution cause a management controller to perform various tasks.

The machine-readable instructions include modular assembly memory access instructions 402 to access memories of installed modular assemblies in an electronic device, to retrieve identifiers of the installed modular assemblies from the memories.

The machine-readable instructions include request sending instructions 404 to send a request including the identifiers to retrieve assembly information elements for the installed modular assemblies from a data repository (e.g., 118 in FIG. 1) that includes a collection of assembly information elements for respective modular assemblies of a collection of candidate modular assemblies that are installable in electronic devices. The request may be sent to the data repository, or to an intermediate entity such as the modular assembly information compiler 122 of FIG. 1.

The machine-readable instructions include compiled modular assembly information obtaining instructions 406 to, based on the request, obtain a compiled representation of the assembly information elements for the installed modular assemblies. The compiled representation may be generated by the management controller from the assembly information elements returned by the data repository to the management controller. Alternatively, the compiled representation may be generated by the intermediate entity (e.g., the modular assembly information compiler 122) from the assembly information elements retrieved by the intermediate entity from the data repository. The intermediate entity sends the compiled representation to the management controller.

The machine-readable instructions include compiled modular assembly information storage instructions 408 to store the compiled representation of the assembly information elements in a memory accessible by machine-readable instructions of the electronic device when interacting with the installed modular assemblies. The machine-readable instructions can include firmware and/or software executable by the management controller or a CPU.

Figure 5:
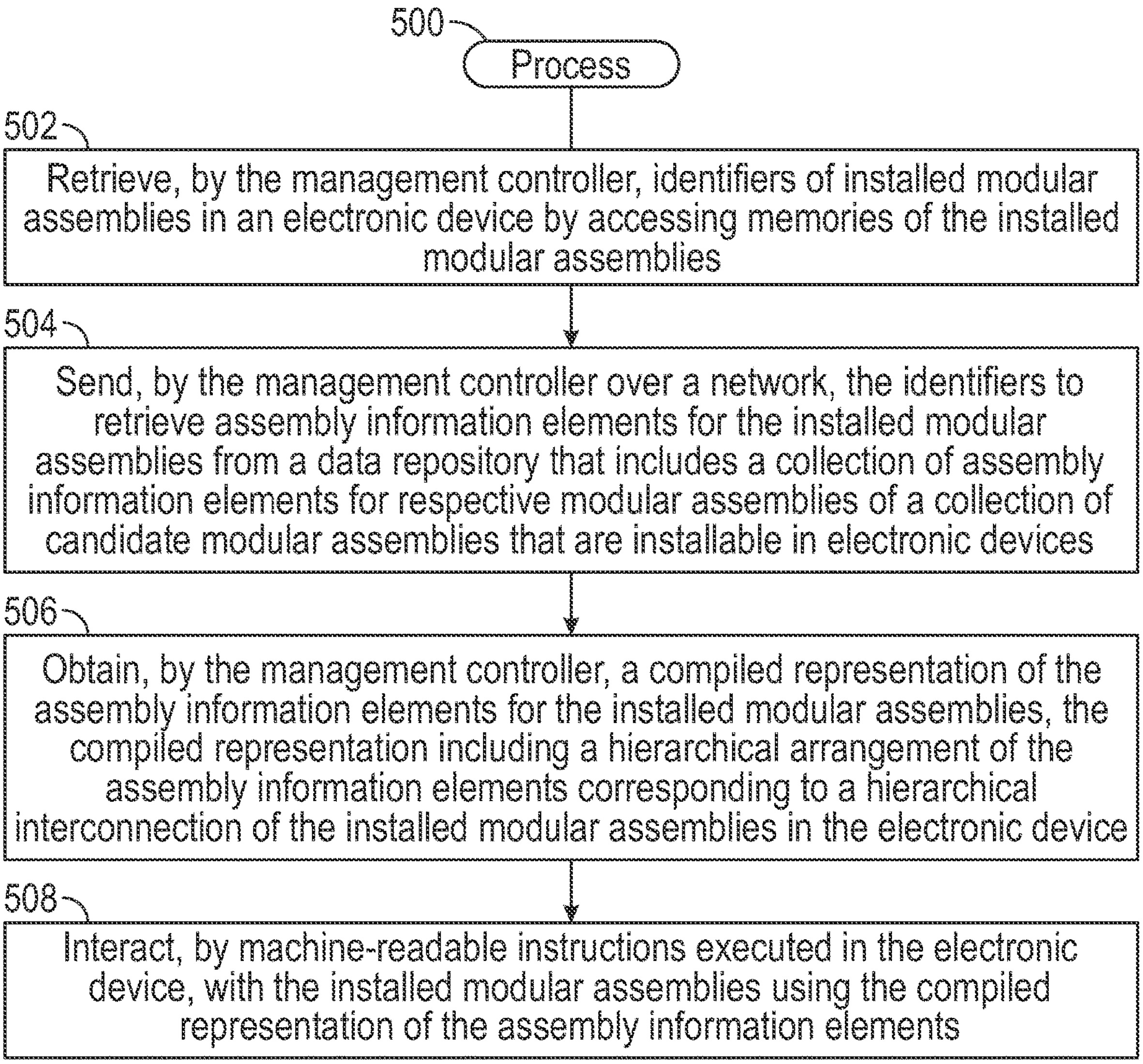
FIG. 5 is a flow diagram of a process according to some examples.

FIG. 5 is a flow diagram of a process 500, which may be performed by a management controller (such as a BMC) or by a combination of the management controller and another entity, such as the modular assembly information compiler 122 of FIG. 1.

The process 500 includes retrieving (at 502), by the management controller, identifiers of installed modular assemblies in an electronic device by accessing memories of the installed modular assemblies. The memories store the identifiers.

The process 500 includes sending (at 504), by the management controller over a network, the identifiers to retrieve assembly information elements for the installed modular assemblies from a data repository that includes a collection of assembly information elements for respective modular assemblies of a collection of candidate modular assemblies that are installable in electronic devices. The identifiers can be sent with a request, either to the data repository or to an intermediate device.

The process 500 includes obtaining (at 506), by the management controller, a compiled representation of the assembly information elements for the installed modular assemblies, the compiled representation including a hierarchical arrangement of the assembly information elements corresponding to a hierarchical interconnection of the installed modular assemblies in the electronic device.

The process 500 includes interacting (at 508), by machine-readable instructions executed in the electronic device, with the installed modular assemblies using the compiled representation of the assembly information elements.

A "BMC" (e.g., the BMC 104 of FIG. 1) can refer to a specialized service controller that monitors the physical state of an electronic device using sensors and communicates with a remote management system (that is remote from the electronic device) through an independent "out-of-band" connection. The BMC can perform management tasks to manage components of the electronic device. Examples of management tasks that can be performed by the BMC can include any or some combination of the following: power control to perform power management of the electronic device (such as to transition the electronic device between different power consumption states in response to detected events), thermal monitoring and control of the electronic device (such as to monitor temperatures of the electronic device and to control thermal management states of the electronic device), fan control of fans in the electronic device, system health monitoring based on monitoring measurement data from various sensors of the electronic device, remote access of the electronic device (to access the electronic device over a network, for example), remote reboot of the electronic device (to trigger the computer system to reboot using a remote command), system setup and deployment of the electronic device, system security to implement security procedures in the electronic device, and so forth.

In some examples, the BMC can provide so-called "lights-out" functionality for an electronic device. The lights out functionality may allow a user, such as a systems administrator, to perform management operations on the electronic device even if an operating system (OS) is not installed or not functional on the electronic device.

Moreover, in some examples, the BMC can run on auxiliary power provided by an auxiliary power supply (e.g., a battery); as a result, the electronic device does not have to be powered on to allow the BMC to perform the BMC's operations. The auxiliary power supply is separate from a main power supply that supplies powers to other components (e.g., a main processor, a memory, an I/O device, etc.) of the electronic device.

A storage medium (314 in FIG. 3 or 400 in FIG. 4) can include any or some combination of the following: a semiconductor memory device such as a DRAM or SRAM, an erasable and programmable read-only memory (EPROM), an electrically erasable and programmable read-only memory (EEPROM) and flash memory; a magnetic disk such as a fixed, floppy and removable disk; another magnetic medium including tape; an optical medium such as a compact disk (CD) or a digital video disk (DVD); or another type of storage device. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the present disclosure, use of the term "a," "an," or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. An electronic device comprising:

a management controller to:

retrieve identifiers of modular assemblies installed in the electronic device;

access a data repository based on the identifiers of the modular assemblies to retrieve assembly information elements of the modular assemblies, wherein each assembly information element of the assembly information elements contains a program code of a respective modular assembly of the modular assemblies;

obtain a compiled representation of the assembly information elements containing the program codes of the modular assemblies; and store, in a memory, the compiled representation of the assembly information elements; and a non-transitory storage medium storing instructions that upon execution cause the electronic device to use the compiled representation of the assembly information elements retrieved from the memory in interactions with the modular assemblies, the interactions comprising launching a first program code of a first modular assembly of the modular assemblies, the first program code being part of the program codes contained in the compiled representation of the assembly information elements.

2. The electronic device of claim 1, wherein the management controller is to retrieve the identifiers of the modular assemblies from respective memories of the modular assemblies.

3. The electronic device of claim 1, wherein the data repository comprises assembly information elements for a collection of modular assemblies, and wherein the modular assemblies identified by the identifiers are part of a subset of the collection of modular assemblies.

4. The electronic device of claim 3, wherein the collection of modular assemblies comprises a modular assembly that is not a member of the subset.

5. The electronic device of claim 1, wherein an assembly information element of the assembly information elements further contains one or more of:

information relating to a model of a respective modular assembly of the modular assemblies,
a part number of the respective modular assembly,
a serial number of the respective modular assembly,
manufacturing information of the respective modular assembly, or
revision information of the respective modular assembly.

6. The electronic device of claim 1, wherein each assembly information element of the assembly information elements further contains:
an operation parameter of a respective modular assembly of the modular assemblies, and
wherein the instructions upon execution cause the electronic device to perform power or thermal management of the first modular assembly using a first operation parameter for the first modular assembly, the first operation parameter being part of the operation parameters contained in the compiled representation of the assembly information elements.

7. The electronic device of claim 1, wherein the management controller is to perform the retrieving, the accessing, the obtaining, and the storing during a manufacturing stage of the electronic device.

8. The electronic device of claim 1, further comprising:
a central processing unit (CPU),
wherein the management controller comprises a baseboard management controller (BMC) separate from the CPU, and the instructions comprise instructions of the BMC or instructions executable on the CPU.

9. The electronic device of claim 1, wherein the management controller is to identify the modular assemblies installed in the electronic device based on application of a root of management process that gathers information of a primary system and accumulates information of a plurality of branches from the primary system, wherein the modular assemblies are represented by respective branches of the plurality of branches.

10. The electronic device of claim 9, wherein the primary system is represented by a root of a hierarchy from which the plurality of branches depend.

11. The electronic device of claim 10, wherein the plurality of branches comprise multiple levels of branches, and the management controller is to identify the modular assemblies installed in the electronic device based on iteratively traversing the multiple levels of branches using connectivity information in the assembly information elements.

12. The electronic device of claim 11, wherein a branch in a first level of the multiple levels represents a connection plane to which one or more modular assemblies are removably connected, and wherein the one or more modular assemblies removably connected to the connection plane are part of a second level in the hierarchy that is below the first level.

13. The electronic device of claim 1, wherein the modular assemblies comprise field replaceable units (FRUs).

14. The electronic device of claim 1, wherein an assembly information element for the first modular assembly comprises a reference link that refers to an external source of information for the first modular assembly, and wherein the compiled representation of the assembly information elements obtained by the management controller comprises the information obtained from the external source using the reference link.

15. The electronic device of claim 1, wherein each assembly information element of the assembly information elements further contains:
information of a management protocol supported by a respective modular assembly of the modular assemblies, and
wherein the instructions upon execution cause the electronic device to perform a security check of the first modular assembly using the information of the management protocol supported by the first modular assembly.

16. A non-transitory machine-readable storage medium comprising instructions that upon execution cause an electronic device to:
access memories of installed modular assemblies in the electronic device, to retrieve identifiers of the installed modular assemblies from the memories;
access a data repository based on the identifiers to retrieve assembly information elements for the installed modular assemblies, wherein each assembly information element of the retrieved assembly information elements contains a program code of a respective modular assembly of the installed modular assemblies, and the data repository includes a collection of assembly information elements for respective modular assemblies of a collection of candidate modular assemblies that are installable in electronic devices;
obtain a compiled representation of the retrieved assembly information elements containing the program codes of the installed modular assemblies; and
use the compiled representation of the retrieved assembly information elements in interactions with the installed modular assemblies, the interactions comprising launching a first program code of a first modular assembly of the installed modular assemblies, the first program code being part of the program codes contained in the compiled representation of the retrieved assembly information elements.

17. The non-transitory machine-readable storage medium of claim 16, wherein the compiled representation of the retrieved assembly information elements comprises a hierarchical arrangement of the retrieved assembly information elements representing a hierarchical interconnection of the installed modular assemblies in the electronic device.

18. The non-transitory machine-readable storage medium of claim 17, wherein the hierarchical arrangement of the retrieved assembly information elements comprises multiple levels of branches representing respective modular assemblies of the installed modular assemblies, and wherein the instructions upon execution cause the electronic device to identify the installed modular assemblies in the electronic device based on iteratively traversing the multiple levels of branches using connectivity information in the retrieved assembly information elements.

19. A method comprising:
retrieving, by a management controller, identifiers of installed modular assemblies in an electronic device by accessing memories of the installed modular assemblies;
sending, by the management controller over a network, the identifiers to retrieve assembly information elements for the installed modular assemblies from a data repository that includes a collection of assembly information elements for respective modular assemblies of a collection of candidate modular assemblies that are installable in electronic devices, wherein each assembly information element of the retrieved assembly information elements contains a program code of a respective modular assembly of the modular assemblies;

obtaining, by the management controller, a compiled representation of the retrieved assembly information elements for the installed modular assemblies, the compiled representation comprising a hierarchical arrangement of the retrieved assembly information elements corresponding to a hierarchical interconnection of the installed modular assemblies in the electronic device; and interacting, by machine-readable instructions executed in the electronic device, with the installed modular assemblies using the compiled representation of the retrieved assembly information elements, the interactions comprising launching a first program code of a first modular assembly of the installed modular assemblies, the first program code being part of the program codes contained in the compiled representation of the retrieved assembly information elements.

20. The method of claim 19, wherein the compiled representation comprises entries correlating the identifiers of the installed modular assemblies to the retrieved assembly information elements.

* * * * *